(12) United States Patent
Kom et al.

(10) Patent No.: US 11,985,803 B1
(45) Date of Patent: May 14, 2024

(54) THERMAL MANAGEMENT FOR CONTAINER-BASED DATA CENTERS

(71) Applicant: Core Scientific Operating Company, Bellevue, WA (US)

(72) Inventors: Lawrence Kom, Redmond, WA (US); Thomas Middleton Rutledge Fuller, Seattle, WA (US); Richard Dunne, Saratoga Springs, NY (US)

(73) Assignee: Core Scientific Operating Company, Austin, TX (US)

( * ) Notice: Subject to any disclaimer, the term of this patent is extended or adjusted under 35 U.S.C. 154(b) by 86 days.

(21) Appl. No.: 17/749,550

(22) Filed: May 20, 2022

Related U.S. Application Data (60) Provisional application No. 63/191,438, filed on May 21, 2021.

(51) Int. Cl.
| | |
|---|---|
| *G06F 1/16* | (2006.01) |
| *G05D 23/19* | (2006.01) |
| *H05K 5/00* | (2006.01) |
| *H05K 7/00* | (2006.01) |
| *H05K 7/20* | (2006.01) |

(52) U.S. Cl.
CPC ..... *H05K 7/20836* (2013.01); *G05D 23/1925* (2013.01); *H05K 7/20718* (2013.01)

(58) Field of Classification Search
CPC ........... H05K 7/20836; H05K 7/20718; H05K 7/20709; H05K 7/20727; H05K 7/20736; H05K 7/20745; H05K 7/20754; H05K 7/207; G05D 23/1925
See application file for complete search history.

(56) References Cited

U.S. PATENT DOCUMENTS

| | | | | |
|---|---|---|---|---|
| 8,578,726 | B2* | 11/2013 | Hay | G06F 1/20 62/171 |
| 9,433,122 | B2* | 8/2016 | Ohba | H05K 7/20 |
| 9,811,129 | B2* | 11/2017 | Kobayashi | H05K 7/20836 |
| 2004/0240514 | A1* | 12/2004 | Bash | H05K 7/20836 374/109 |
| 2006/0016901 | A1* | 1/2006 | Beitelmal | H05K 7/20209 236/49.3 |
| 2006/0168975 | A1* | 8/2006 | Malone | H05K 7/20836 236/49.3 |
| 2009/0326721 | A1* | 12/2009 | Sugiyama | F24F 11/0001 700/282 |
| 2012/0041600 | A1* | 2/2012 | Michael | G06F 9/505 700/276 |
| 2013/0042639 | A1* | 2/2013 | Kobayashi | H05K 7/20836 62/89 |

(Continued)

*Primary Examiner* — Anthony M Haughton
(74) *Attorney, Agent, or Firm* — Fishman Stewart PLLC (57) ABSTRACT

Systems and methods for managing airflow for cooling computing devices (e.g., in a data center) are disclosed. To prevent damage to computing devices after power outages in low temperatures, a subset of the computing devices may be preheated, started, and operated in an exhaust air recirculation mode to raise the temperatures of the other computing devices. Preheating may for example use heaters or warm air temporarily diverted from external sources such as nearby buildings. Thermal mass (e.g., phase change material) may be positioned near the computing devices to capture heat that is later released in the event of a dramatic temperature drop such a cold weather power outage.

19 Claims, 8 Drawing Sheets

(56) References Cited

U.S. PATENT DOCUMENTS

| | | | | |
|---|---|---|---|---|
| 2015/0053430 A1* | 2/2015 | Beresford | ............ | A62C 35/00 |
| | | | | 169/45 |
| 2016/0021792 A1* | 1/2016 | Minegishi | .......... | H05K 7/20745 |
| | | | | 165/281 |
| 2022/0217876 A1* | 7/2022 | Gwin | ................. | H05K 7/20254 |
| 2022/0361371 A1* | 11/2022 | Unton | ................ | H05K 7/20327 |

* cited by examiner

THERMAL MANAGEMENT FOR CONTAINER-BASED DATA CENTERS

CROSS-REFERENCE TO RELATED APPLICATION

This application claims the benefit of and priority to U.S. Provisional Patent Application Ser. No. 63/191,438, filed on May 21, 2021, the disclosure of which is hereby incorporated by reference in its entirety as though fully set forth herein.

TECHNICAL FIELD

The present disclosure generally relates to the field of computing and, more particularly, to systems and methods for managing airflow for groups of computing devices in containers, such as in a container-based data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Many data centers face cooling challenges, and data centers housing large numbers of miners or other CPU- or GPU-based systems used for compute intensive workloads (e.g., rendering, AI, machine learning, scientific simulation, data science) have even greater cooling challenges. This is due to the significantly higher density, power usage, heat generation, and duty cycle common to these devices and workloads.

The heat in data centers can often exceed the cooling ability of a computing device's built-in fans, which force air across heat sinks on the computing device in order to extract and exhaust the waste heat. Traditional methods for improving cooling of computing devices in data centers include mixing in refrigerated air to reduce the temperature of the air that is forced across the computing device by its built-in cooling fans. A significant drawback to this approach is that refrigeration uses significant amounts of energy on top of the energy already used by the computing devices themselves.

For these reasons, new data center architectures have been designed to dramatically improve airflow so that ambient air can be used for cooling most if not all of the year based on the location of the data center. One type of data center architecture that is increasingly popular is a container-based data center. In container-based architectures, computing devices are housed on racks inside containers (e.g., shipping containers). Depending on the configuration, these containers can provide the improved airflow described above. In addition, these container-based data centers have several other advantages over traditional data centers, including lower cost, easier mobility, and the potential for lower environmental impact.

One drawback to these improved airflow designs, and container-based designs in particular, occurs during winter when the ambient air temperature drops so low that the computing devices begin to perform poorly as they are below their minimum designed operating temperature. Some data centers may use heat pumps or furnaces to preheat the air incoming to the data center or mixing chambers with recirculating fans, ductwork and valves that mix the exhaust heat from the computing devices with the incoming air to raise the temperature. However, heating the air with heat pumps or furnaces is not energy efficient, using mixing chambers with recirculating ductwork can negatively impact airflow, and using additional fans consumes additional energy and can further reduce system efficiency.

Traditional data centers rely on backup generators or batteries to reduce or eliminate power outages, but these are not appropriate solutions for data centers operating at high power levels and seeking the highest efficiencies at the lowest cost. For these types of data centers, power outages are much more frequent than at traditional data centers. For efficiency reasons, many of these types of data centers are located in colder climates. In very cold temperatures, an interruption in power can quickly cause the temperature of the computing devices to fall below their safe operating temperature range (e.g., ambient temperature of 15 to 35 degrees Celsius). Restarting these computing devices once they are below their safe operating temperature may cause damage or may simply fail due to insufficient current or voltage being available at the component level within the device.

For at least these reasons, there is a desire for a solution that efficiently cools computing devices in containers when temperatures are high, efficiently maintains temperatures above undesirable levels when ambient temperatures are low, and permits safe restarting of the computing devices after a power outage when ambient temperatures are low.

SUMMARY

An improved system and method for operating a plurality of computing devices (e.g., in a container-based data center)

is contemplated. By monitoring temperatures, and preheating computing devices, the computing devices may be safely restarted after low temperature power outages. Preheating may for example use heaters or warm air temporarily diverted from external sources such as nearby buildings. To mitigate shorter cold weather power outages, thermal mass (e.g., phase change material or "PCM") may be positioned near the computing devices to capture heat from normal operation that is then released during cold weather power outages to reduce unwanted low temperature spikes.

In one embodiment, the method comprises positioning the computing devices on racks within containers that each have an intake side vent and an exhaust side vent. A thermal mass is positioned in at least one of the containers to absorb heat generated by the computing devices during operation and release it during cold weather power outages. The thermal mass may for example be steel, stone, or a phase change material (PCM). Each of computing devices have an associated cooling fan configured to generate airflow through the computing device and exhaust hot air out the exhaust side vent. The containers may be configured into two modes. In the first mode, cool air is drawn in from the intake side vent and hot air is exhausted from the exhaust side vent. Temperature data such as ambient temperatures and or weather forecast data is read, and in response to the temperature data being below a predetermined threshold, one or more of the containers may be selected and temporarily reconfigured in a second mode to draw in hot air exhausted via the container's intake side vent. When ambient temperatures are too low for efficient operation of the computing devices, switching modes to draw in hot air may improve the efficiency of the computing devices.

In some embodiments, in response to a power outage and the temperature data being below a predetermined minimum starting temperature for the computing devices, one of the containers may be temporarily reconfigured to receive warmer than ambient air from an external source such as another building. In some embodiments, a heater may be used to preheat a subset of the computing devices in at least one of the containers.

In some embodiments, the temporary reconfiguring may be accomplished by connecting the first selected container's intake side vent to the second selected container's exhaust side vent and or temporarily moving the first selected container adjacent to a second container so that the first selected container's intake side vent is adjacent to the second container's exhaust side vent. Adjacent in this context includes, for example, being near enough to draw in enough hot air from the exhaust side vent to raise the temperature of the air cooling the computing devices above a predetermined minimum desired operating temperature.

In some embodiments, in response to the temperature data being below a predetermined threshold, a third container may be temporarily reconfigured to draw hot air that is exhausted by the first selected container into the third selected container's intake side vent. This creates a three-container chain of adjacent containers. As with the first two containers, the third container may be reconfigured by connecting the third container's intake side vent to the first selected container's exhaust side vent and or temporarily moving the third container adjacent to the first selected containers so that the third container's intake side vent is adjacent to the first selected container's exhaust side vent. In some embodiments, one or more of the containers may be placed on wheels or other sliding mechanisms to permit easier movement.

In some embodiments, the speed of the cooling fans in a container may be increased in response to being in the first mode and decreased in response to being reconfigured in the second mode. As the air may have a higher pressure from being exhausted, the computing devices in the receiving container may not need to spin as fast to ensure proper airflow when in the second (low ambient temperature) mode.

In some embodiments, the method may be implemented as a computer program having instructions executable by a processor of a computational device and stored on a non-transitory, computer-readable storage medium (e.g., disk or flash memory). When executed, the instructions may cause the computational device to configure a set of movable containers in one of two modes. As described above, each container may have an intake side vent, an exhaust side vent, and shelves for supporting computing devices with cooling fans. In the first mode, the computing devices' fans generate an airflow through the computing device where cool air is drawn into each of the containers from the intake side vents and hot air is exhausted from a second side. Temperature data (e.g., weather forecast data and ambient temperature data) is read. In response to the temperature data being below a predetermined threshold, one or more of the containers are temporarily reconfigured into a second mode where they draw in (via their intake side vents) hot air exhausted out the exhaust side vents of other containers. In some embodiments, in response to the temperature data being below a predetermined threshold, a third container may be selected and configured to draw in hot air exhausted by the second container (e.g., creating a cool-hot-hot chain of containers).

A method for starting a plurality of computing devices in a container-based facility is also contemplated. In embodiments, the method may comprise positioning the plurality of computing devices on a plurality of racks in a plurality of containers and measuring a first temperature inside a first container of the plurality of containers. In response to the first temperature being below a predetermined minimum operating temperature, at least a first subset of the computing devices in the first container may be preheated and started. Heated exhaust air from the first subset of computing devices may be directed into the first container to heat it, and then the remainder of the computing devices in the first container may be started. Heated exhaust air from the first container may then be directed to a second container to preheat the devices in that container. Once the temperature reaches or exceeds the predetermined minimum operating temperature, those devices may be started. This process may be repeated for the remaining containers until all containers have met the predetermined minimum operating temperature and the computing devices have been started. A thermal mass may also be positioned in one or more of the containers to reduce the rate of temperature change in the event of a power failure during cold ambient temperatures.

A system for managing temperatures in a container-based data center is also contemplated. In one embodiment, the system may comprise a set of containers, each having an intake side vent and an exhaust side vent, and a set of racks, each positioned inside one of the containers. The racks are configured to hold computing devices with cooling fans that are configured to generate an airflow through the computing device and exhaust hot air out the container's exhaust side vent. The system may also have a controller that configures each of the containers into one of two different modes. In the first mode, cool air is drawn into the container from the intake side vents and hot air is exhausted from a second side.

The controller may be configured to read temperature data such as ambient temperature read from a temperature sensor and or weather forecast data (e.g., from a network-based forecast service). A thermal mass may be positioned within one or more of the containers. The thermal mass may be sized to maintain the temperature of the computing devices in the first container above a minimum operating temperature for a predetermined period of time, e.g., at least a first hour of a cold weather power outage while ambient temperatures at the container are at seasonal lows. This period of time would apply after the container and thermal mass have come up to normal operating temperature (e.g., after operating for at least one hour).

In response to the temperature data being below a predetermined threshold, the controller may temporarily reconfigure at least one container into a second mode to draw in hot air exhausted by computing devices rather than just drawing in cool air. In some embodiments, this is accomplished by moving the computing devices in the first selected container away from the exhaust side vent of the first selected container to permit at least a portion of the hot air expelled by the computing devices to recirculate within the container.

In other embodiments, the second mode is configured by drawing the hot air into the container from the exhaust of another nearby container. This may be accomplished by positioning the first container's intake vent near the second container's exhaust vent (e.g., by temporarily moving the containers closer to each other so that one container's intake side vent is adjacent to another container's exhaust side vent). In other embodiments where moving containers is not desired, it may be accomplished using direct connection between the two containers (e.g., with one or more adjustable air deflectors or valves that can direct exhaust air from one container into the other container, or direct exhaust air away and direct ambient cool air to the intake vent).

In some embodiments, the controller may be configured to temporarily reconfigure a third container to draw in hot air exhausted via its intake side vent from a second container that is already drawing in hot air exhausted by a first container, effectively creating a three-container chain. Additional longer chains are also possible and contemplated.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1A:
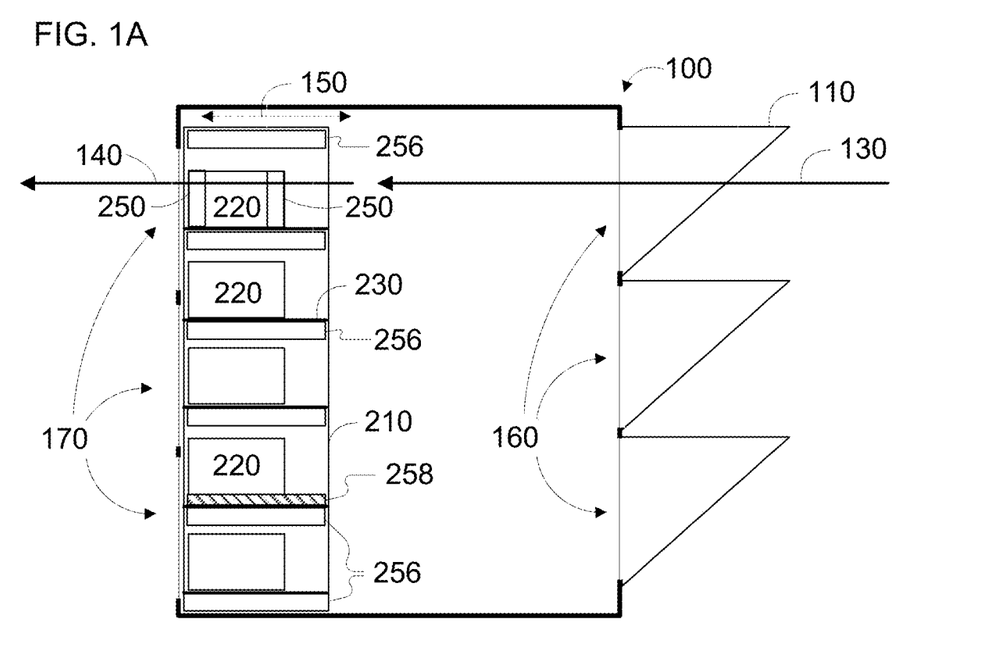
FIG. 1A is a side view of one example embodiment of a container-based data center for computing devices in a first configuration for normal temperatures.

Turning now to FIG. 1A, a side view of one example embodiment of a container-based data center for computing devices in a first configuration for normal temperatures is shown. In this example embodiment, the data center comprises one or more containers 100 (e.g., repurposed shipping containers) that each hold one or more racks 210 with a number of shelves 230 configured to support a number of computing devices 220. The computing devices in containers 100 are connected to power and network connections, as well as to a controller that is configured to manage the data center, e.g., providing status updates, configuring the computing devices, and distributing workloads to the computing devices. In this embodiment, container 100 has a set of air intake vents 160 on one side permitting cool outside air to enter the container 100, and a set of air exhaust vents 170 on the other side permitting hot air to be exhausted from the container 100. In some embodiments, air intake vents 160 may have shrouds 110 over them to prevent rain from entering the container 100. Shrouds 110 may also hold air filters to prevent debris from entering the container 100.

In the normal mode of operation illustrated, air is drawn into container 100 through air intake vents 160 as shown by arrow 130. The air is drawn into the container 100 by cooling fans 250 that are associated with, or are part of, each of computing devices 220. While some cooling fans 250 may be small in diameter, a large number of them in parallel can create a significant air flow. The cool ambient air drawn into container 100 is pulled through computing devices 220 by cooling fans 250, extracting waste heat as it passes through the computing devices 220 (e.g. by passing over heatsinks). The heated air is then exhausted out of the container 100 through air exhaust vents 170 as shown by arrow 140. In this embodiment, rack 210 is configured to slide horizontally as shown by arrow 150. This may for example the achieved by mounting rack 210 on sliding rails or rollers. As shown in this example, rack 210 is positioned immediately adjacent to the wall of container 100 against air exhaust vents 170 to permit computing devices 220 and cooling fans 250 to exhaust hot air out of container 100. Air exhaust vents 170 maybe sealed to cooling fans 250 and computing devices 220 to prevent exhausted hot air from reentering container 100. However, complete sealing is not required, and some minor leakage of hot air from outside to inside the container and vice versa may occur (e.g., around access doors to the hot aisle, and around the edges of the computing devices 220 by the air exhaust vents 170) without significantly negatively impacting performance.

One advantage of container-based housing for computing devices is the lower cost, efficient material usage, and smaller physical footprint. However, containers placed outside may experience colder temperatures than traditional racks placed within warehouse-type data centers with their own HVAC systems and generator backups. In particular, during a cold weather power outage, the temperatures may drop below the computing devices' minimum operating temperatures, making restarting the computing devices difficult, risky, or impossible.

In some embodiments, a thermal mass 256 may be positioned within one or more of the containers to help address this problem. For example, thermal mass 256 may be attached to the rack 210 near the computing devices. The thermal mass 256 may for example comprise blocks of metal, stone, concrete, or containers of phase change materials ("PCM", e.g., paraffin wax or organic or inorganic PCMs such as Infinite-R™, Templock PCM tiles, or bulk PCM available from Insolcorp, LLC). PCMs absorb and release heat when they change phases. Different PCMs have different phase change temperatures. For example, the PCM may be selected to change phases between 15 degrees Celsius and 35 degrees Celsius.

In some embodiments, the quantity of thermal mass 256 positioned within the container may maintain the temperature of at least a subset of the computing devices above their predetermined starting temperature for at least as long as an average power outage (e.g., one hour at a seasonal average low temperature for the location of the container). For example, in a 2017 report, the American Society of Civil Engineers reported that there were 3,571 total outages in 2015, lasting 49 minutes on average. Similarly, the US Energy Information Administration has estimated that the average power outage is approximately one hour. If maintaining the temperature of the entire container above the predetermined minimum operating temperature is not feasible (e.g., due to space constraints or cost), the thermal mass 256 may be positioned near a subset of the computing devices that can be started first. The heated exhaust from this subset of devices can be directed into the container to heat the rest of the container (as described below). If the outage exceeds the ability of the thermal mass to maintain the temperature above the computing devices minimum operating temperature, a heater 258 (e.g., an electric heating pad) may be used to preheat at least a subset of the computing devices in at least one of the containers.

Figure 1B:
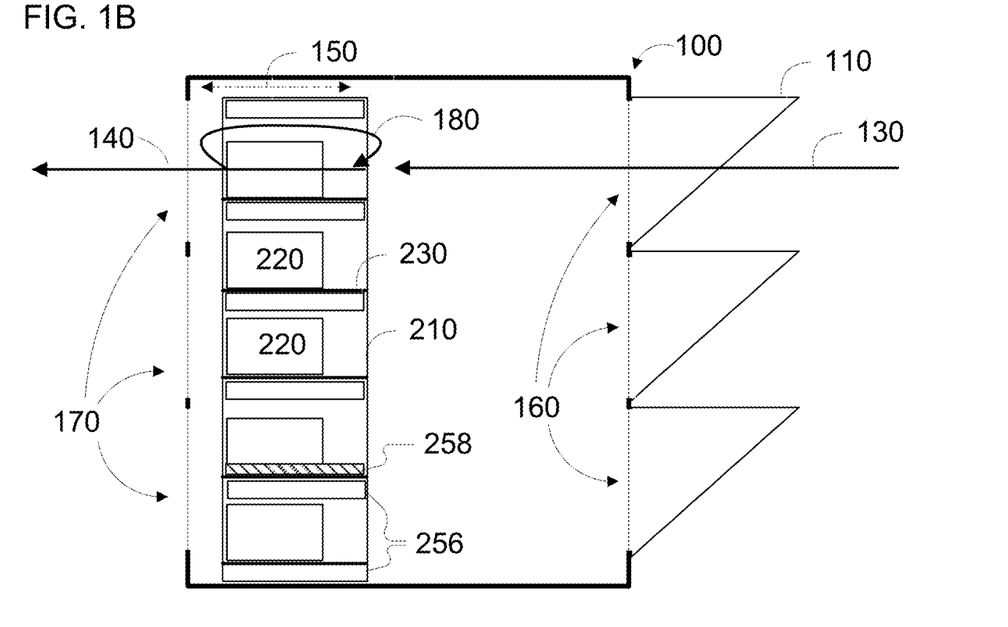
FIG. 1B is a side view of the example embodiment of FIG. 1A in a second configuration for low temperatures according to the teachings of the present disclosure.

Turning now to FIG. 1B, a side view of the example embodiment of FIG. 1A in a second configuration for low temperatures is shown. In this configuration, rack 210 has been moved away from the wall of container 100 and air exhaust vents 170. This prevents all of the hot air from being exhausted out of air exhaust vents 170 and permits some of the hot air to be recirculated into the computing devices to 20 as indicated by arrow 180. In some embodiments, air exhaust vents 170 may be partially blocked to further increase the amount of hot air that is recirculated within the container 100. The more hot air that is recirculated, the higher the temperature of the air entering the computing devices 220. This recirculation mixes the hot exhaust air from computing devices 220 with the cool ambient air drawn into container 100 to bring up the cool temperature to a more acceptable range. For example, some computing devices have a recommended operating temperature range or optimal operating temperature range for performance of 0° C.-40° C., so the predetermined threshold for changing the container from its normal operating mode to this low temperature mode may be 0° C. for more than 30 minutes, or a weather forecast indicating low temperatures at or below 0° C. for a significant period of time such as several hours. Some computing devices may perform better at the middle of their optimal operating temperature, than at the very edge of their recommended operating temperature range, so the temperature threshold may be higher (e.g., 10° C. in the example above).

In some embodiments, additional increases to the temperature of the air flowing through the computing devices may be achieved by further increasing the amount of hot air that is recirculated and mixed into the incoming cool ambient air in the container by configuring one or more of the computing devices 220 into a reverse airflow mode. In reverse airflow mode, the computing device draws air in from the side of the container with air exhaust vents 170 and exhausts air towards air intake vents 160. The reverse airflow mode may for example be implemented by reversing the direction of rotation of the fans in the one or more computing devices or by rotating the fans or computing devices by 180 degrees.

Figure 2:
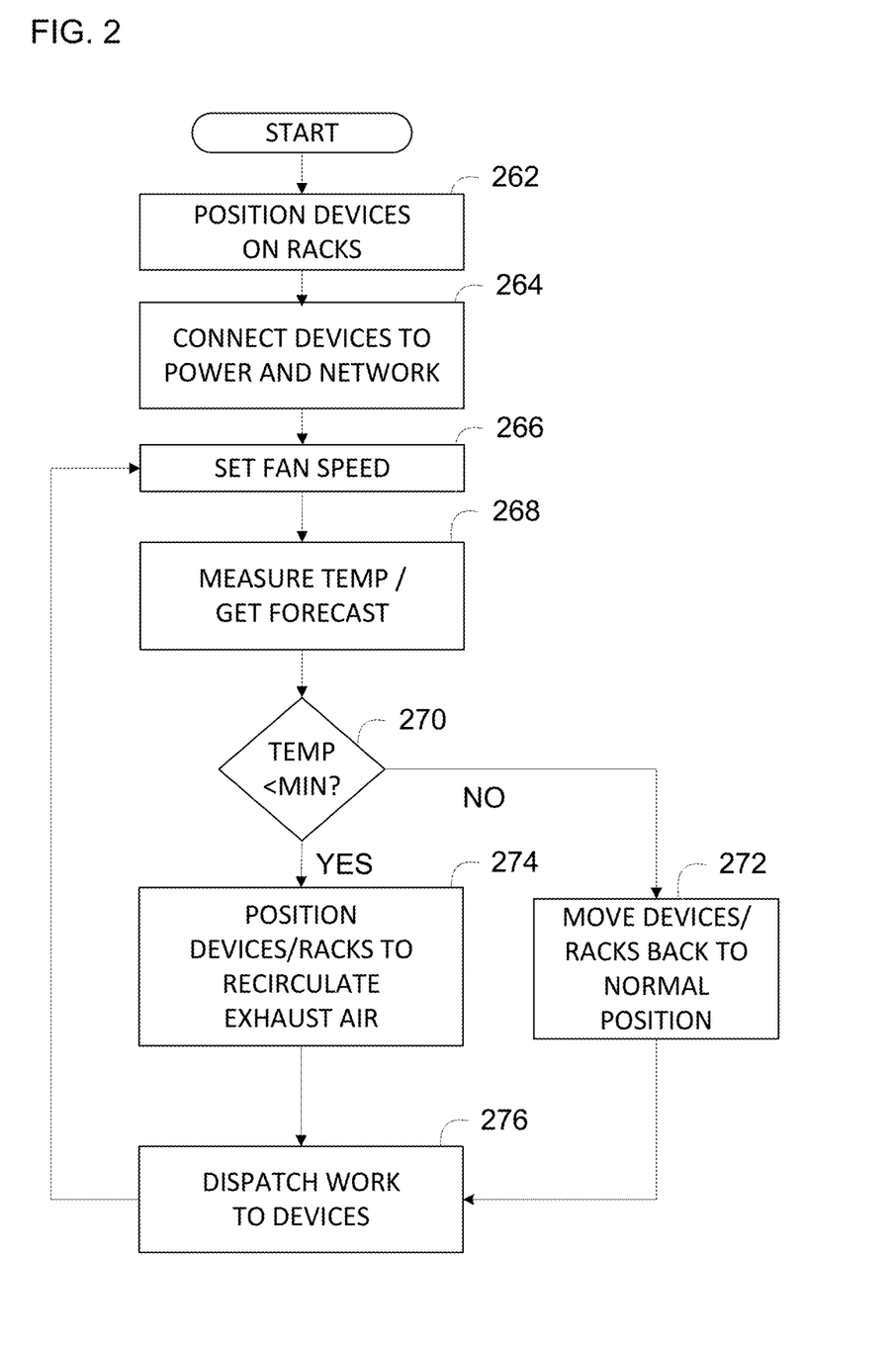
FIG. 2 is a flow chart of an example embodiment of a method for cooling computing devices in a data center according to the teachings of the present disclosure.

Turning now to FIG. 2, a flow chart of an example embodiment of a method for cooling computing devices in a data center according to the teachings of the present disclosure is shown. In this embodiment, the computing devices are positioned on one or more racks (step 262). The devices are connected to power and network connections (step 264). Cooling fan speeds for the computing devices are set/adjusted (step 266), e.g., based on a pattern or predetermined default setting or device temperature. Temperature data is measured (step 268), e.g., by reading an environmental sensor or by gathering data from a networked weather forecast source. If the measured or predicted temperature is below a predetermined desired minimum threshold (step 270), e.g., for longer than a predetermined time period, the racks (or in some embodiments the computing devices themselves) may be moved away from the exhaust air vents to permit some of their exhausted hot air to recirculate (step 274). Exhaust vents may be adjusted if needed to achieve the desired amount of air recirculation. Work is dispatched to the computing devices (step 276), and fan speeds are set/adjusted (step 266) based on the computing devices' temperature. Many computing devices have internal thermostats that indicate for example the processor or motherboard temperature to ensure safe operation. If the measured or predicted temperature is not below the predetermined minimum threshold (step 270), any racks or devices that have been moved may be reset back to their normal airflow mode position (step 272), and any adjusted exhaust vents may be reset or adjusted back to their normal position.

In some embodiments, a controller (which may be one of computing devices 220 or an external computing device outside the container but connected via a network connection) may be configured to control which mode each computing device (and container in the data center) is in based on measured temperatures or weather forecasts. The controller may include a data thermal management software application stored on computer-readable media that when executed responds to measured or forecasted temperatures below a predetermined threshold by generating support tickets for data center staff indicating which containers or devices should be configured in low temperature mode based on the measured or predicted temperature. In some embodiments, the controller may automate the reconfiguration process (e.g. with motorized platforms or sleds for devices, racks, or containers).

Figure 3A:
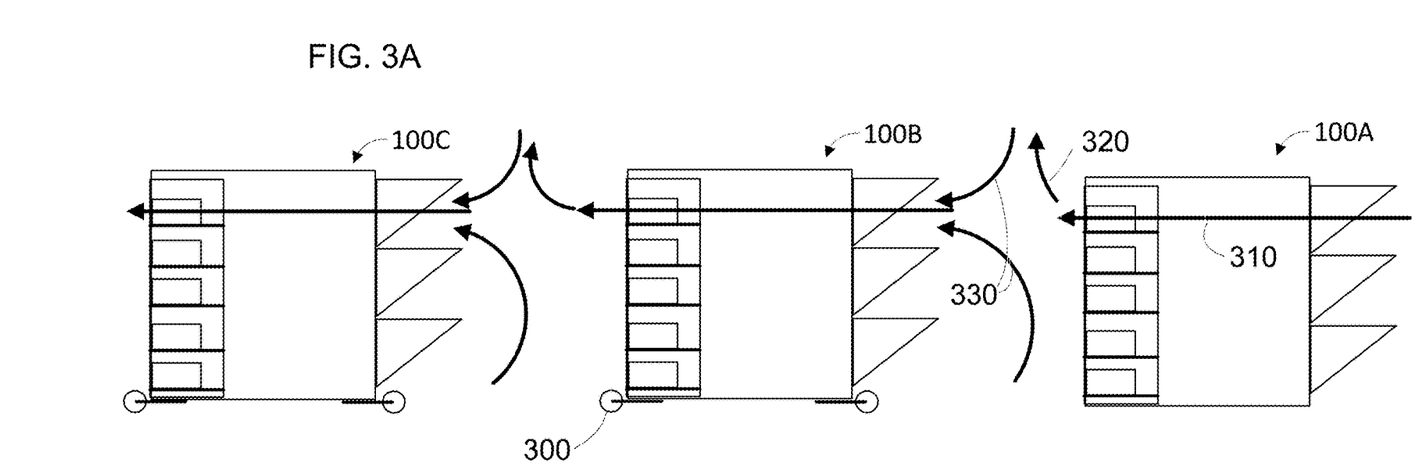
FIG. 3A is a side view of an example embodiment of a system for cooling computing devices in containers in a first configuration for normal temperatures according to the teachings of the present disclosure.

Turning now to FIG. 3A, a side view of an example embodiment of a system for cooling computing devices in containers in a first configuration for normal temperatures according to the teachings of the present disclosure is shown. In this configuration, containers 100A, 100B and 100C are spaced apart far enough that hot air exhausted from them escapes up into the atmosphere as indicated by arrow 320 (because the hot air is hotter than the ambient temperature, it naturally rises). With this spacing, the containers draw in cool ambient air as shown by arrows 310 and 330. Containers 100B and 100C may be configured with wheels 300 or other mechanisms to make moving them easier (e.g., sliding rails, motorized platforms, or motorized winches to pull containers on wheels or rails). In other embodiments, forklifts may be used to move the containers.

Figure 3B:
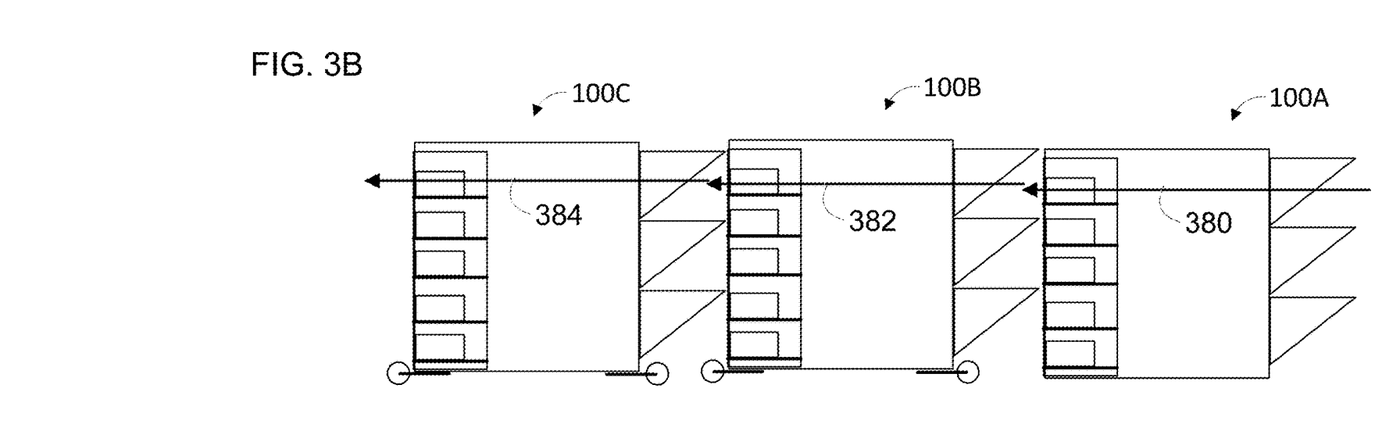
FIG. 3B is a side view of the example embodiment of FIG. 3A in a second configuration for low temperatures according to the teachings of the present disclosure.

Turning now to FIG. 3B, a side view of the example embodiment of FIG. 3A in a second configuration for low temperatures according to the teachings of the present disclosure is shown. In this configuration, the containers are positioned closer to one another such that containers 100B and 100C have their air intake vent close to the exhaust vent of another container. This permits at least some of the exhaust air to be captured, thereby raising the temperature of the air drawn into each subsequent container. Cool ambient air is drawn into container 100A and exhausted as shown by arrow 380, where at least a portion of it is then drawn into container 100B an exhausted as shown by arrow 382, where at least a portion of it is then drawn into container 100C and exhausted as shown by arrow 384. While three containers are shown in this example embodiment, longer chains are possible and contemplated.

Figure 4:
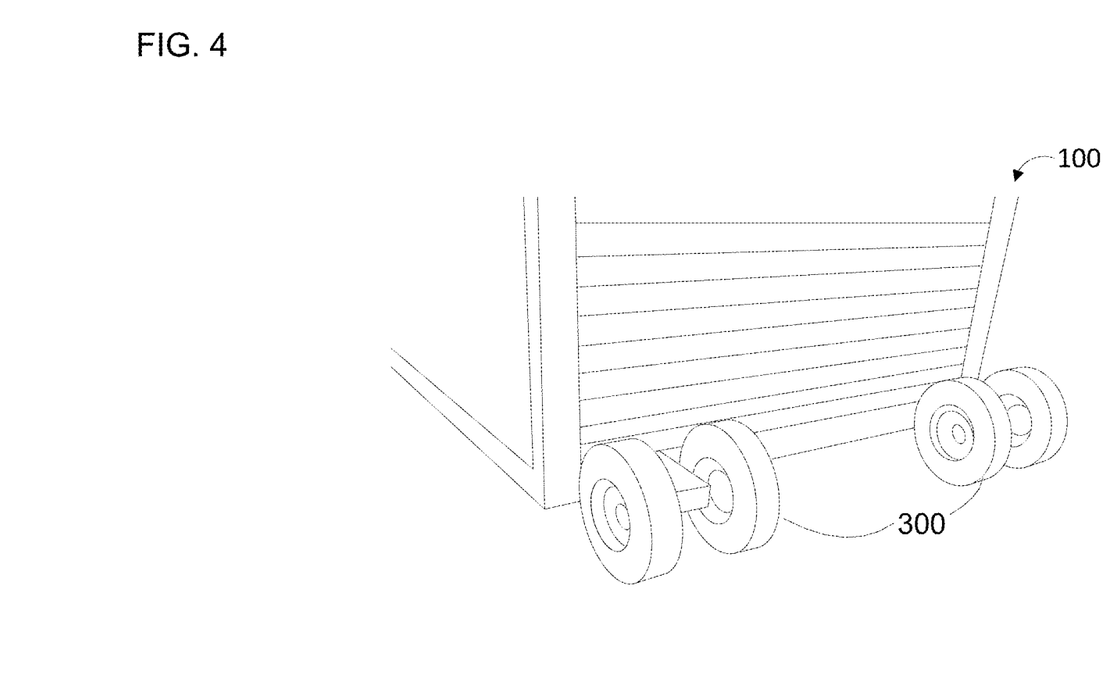
FIG. 4 is a perspective view of a portion of an exterior of one embodiment of container-based data center.

Turning now to FIG. 4, a perspective view of a portion of an exterior of one embodiment of container-based data center is shown. In this embodiment, wheels 300 are connected to container 100 to permit easier movement. Other mechanisms are possible and contemplated, including for example, motorized sleds, and mounting containers 100 on rails. In one embodiment, the containers are mounted with wheels on rails at a slight incline, and automated winches are used to either pull the containers closer together or space them farther apart.

Figure 5A:
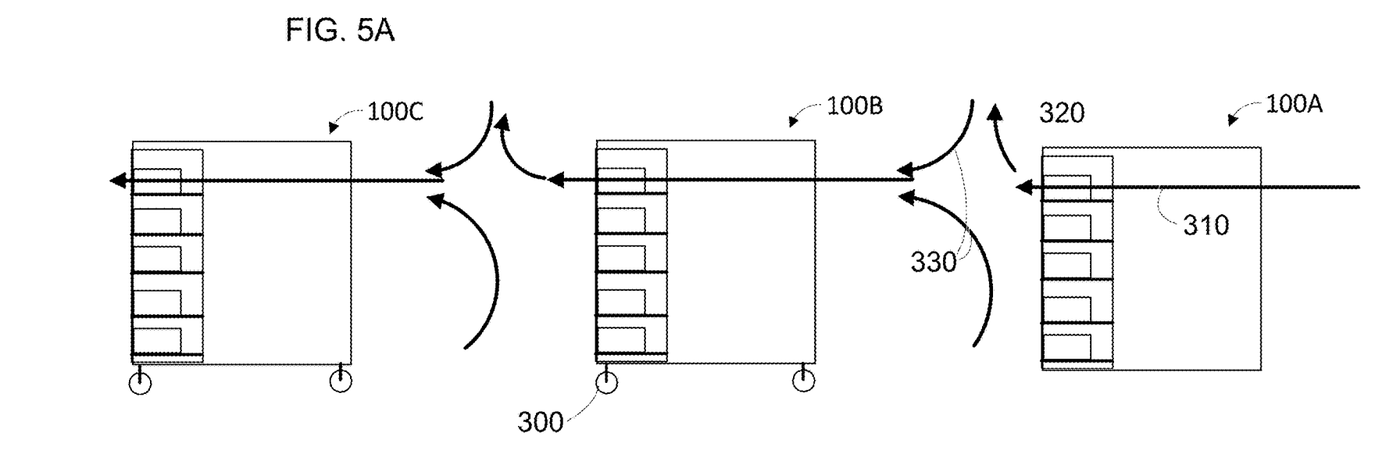
FIG. 5A is a side view of another example embodiment of a system for cooling computing devices in containers in a first configuration for normal temperatures according to the teachings of the present disclosure.

Turning now to FIG. 5A, a side view of another example embodiment of a system for cooling computing devices in containers in a first configuration for normal temperatures according to the teachings of the present disclosure is shown. In this example, containers 100A, 100B and 100C do not have shrouds on their air intake vents.

Figure 5B:
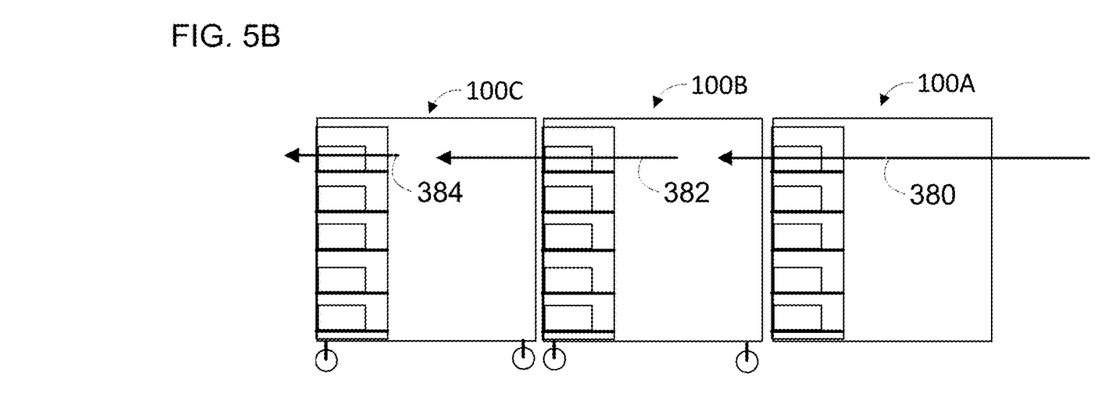
FIG. 5B is a side view of the example embodiment of FIG. 5A in a second configuration for low temperatures according to the teachings of the present disclosure.

Turning now to FIG. 5B, a side view of the example embodiment of FIG. 5A in a second configuration for low temperatures according to the teachings of the present disclosure is shown. Without shrouds, containers 100A, 100B and 100C may be positioned more closely when in their low temperature mode configuration. This may permit more exhaust air to be recaptured. For example, cool ambient air may be drawn into container 100A and exhausted as shown by arrow 380, where most or all of it is then drawn into container 100B an exhausted as shown by arrow 382, where most or all it is then drawn into container 100C and exhausted as shown by arrow 384. In some embodiments, the distance between the containers may be adjusted based on the measured or predicted external air temperature or based on reported computing device temperatures.

In some embodiments, during cold weather, the ambient air drawn into container 100A as shown by arrow 380 may be temporarily drawn from a preheated source (e.g., from a duct connected to a nearby building with its own HVAC system). This may be used to preheat the interior of the container 100A or a subset of the computing devices in the container to permit them to reach their minimum safe operating temperature so that they can be safely started (e.g., after a cold weather power outage).

Figure 6A:
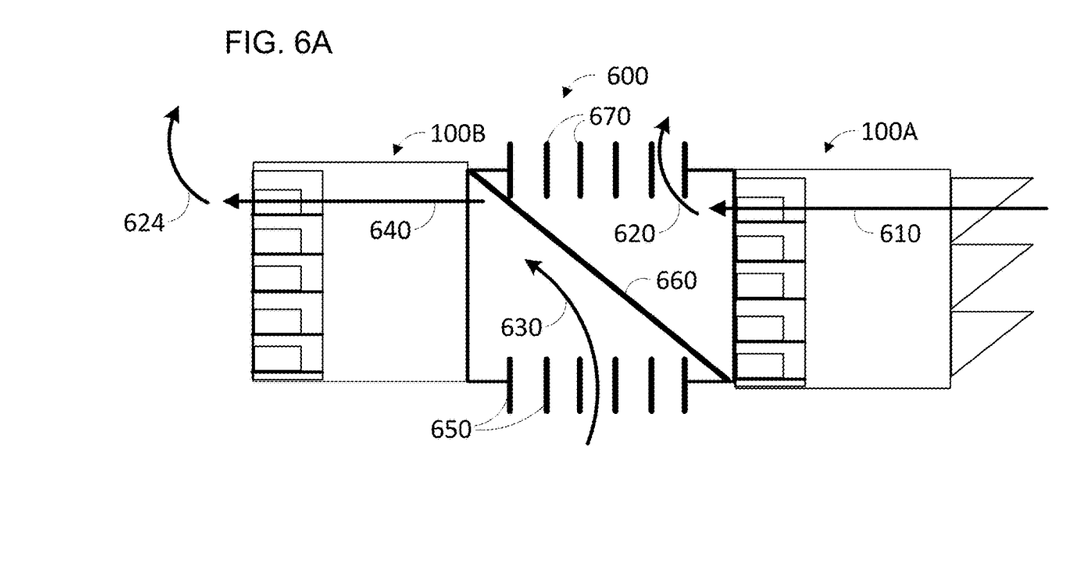
FIG. 6A is a side view of yet another example embodiment of a system for cooling computing devices in containers in a first configuration for normal temperatures according to the teachings of the present disclosure.

Turning now to FIG. 6A, a side view of yet another example embodiment of a system for cooling computing devices in containers in a first configuration for normal temperatures according to the teachings of the present disclosure is shown. In this embodiment, containers 100A and 100B are not configured to move to switch modes. Instead, a connector 600 with a set of adjustable valves 650, 660, and 670 is positioned between them. Valves 650, 660, and 670 may for example be motorized, network-controllable louvers. In the configuration shown in the figure, valves 650 and 670 are open and valves 660 are closed. Cool ambient air is drawn into each container via the container's air intake vents as shown by arrows 610 and 630, and hot air is exhausted from the containers as shown by arrows 620 and 640.

Figure 6B:
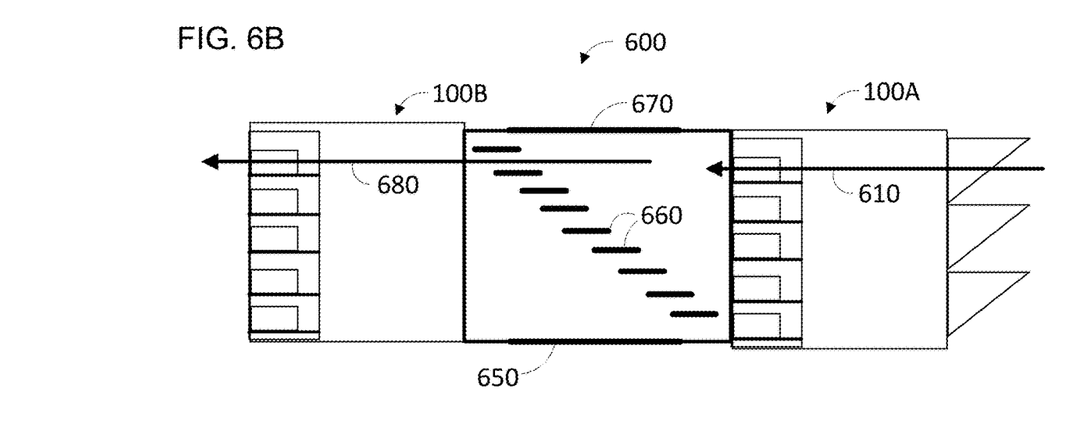
FIG. 6B is a side view of the example embodiment of FIG. 6A in a second configuration for low temperatures according to the teachings of the present disclosure.

Turning now to FIG. 6B, a side view of the example embodiment of FIG. 6A in a second configuration for low temperatures according to the teachings of the present disclosure is shown. In this configuration, valves 650 and 670 are closed, and valves 660 are open. This permits hot exhaust air from container 100A to pass through connector 600 and be drawn into container 100B as shown by arrows 610 and 680. While valves 650 and 670 are shown as completely closed and valve 660 is shown as completely open, in some embodiments the valves may be partially opened or closed based for example on the ambient temperature and the desired operating temperature for the particular computing devices in each container. In some embodiments, connector 600 may itself be constructed of a container similar to containers 100A and 100B, but with motorized valves inside instead of or in addition to racks and computing devices. While not shown in the figures, sensors readable by the controller may be positioned within the containers 100A and 100B, within connector 600, and outside to measure ambient and internal mixed temperatures. Based on these measured temperatures (or predicted temperatures), the controller may dynamically adjust the settings of valves 650, 660, and 670.

Figure 7:
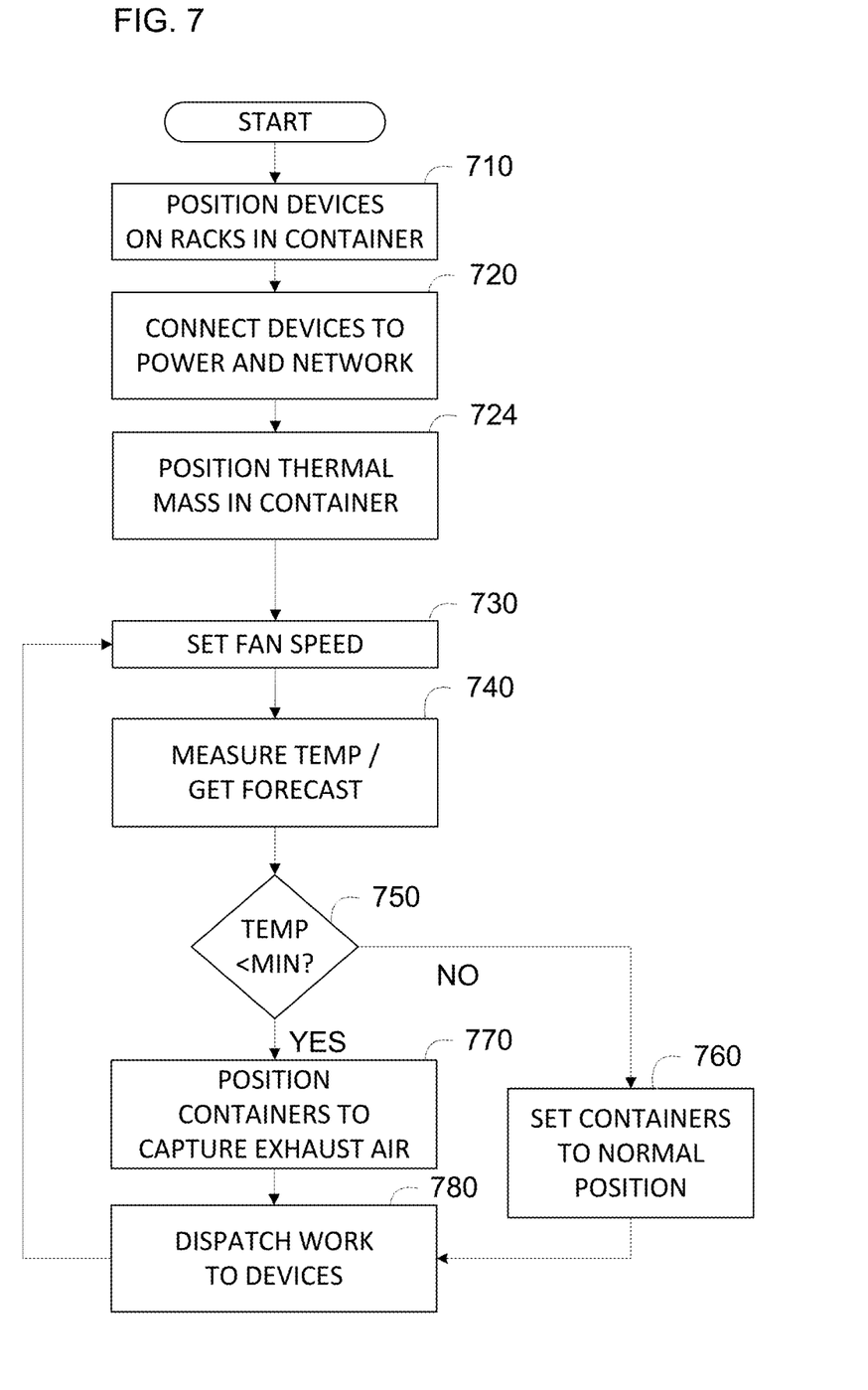
FIG. 7 is a flow chart of another example embodiment of a method for cooling computing devices in a data center according to the teachings of the present disclosure.

Turning now to FIG. 7, a flow chart of another example embodiment of a method for cooling computing devices in a data center according to the teachings of the present disclosure is shown. In this embodiment, the computing devices are positioned on one or more racks (step 710). The devices are connected to power and network connections (step 720), and thermal mass is positioned in the container (step 724). Cooling fan speeds for the computing devices are set/adjusted (step 730), e.g., based on a pattern or predetermined default setting or device temperature. Temperature data is measured (step 740), e.g., by reading an environmental sensor or by gathering data from a networked weather forecast source. If the measured or predicted temperature is below a predetermined desired minimum threshold (step 750), e.g., for longer than a predetermined time period, the containers may be positioned to permit at least some of the exhausted hot air from one container to be captured by the other container or containers (step 770). For example, this may entail moving the containers toward each other so that one container's exhaust air vents are close enough to the other container's air intake vents to permit some of the exhausted hot air to recirculate, or it may entail setting valves in a connector between them. Work is dispatched to the computing devices (step 780), and fan speeds are set/adjusted (step 730) based on the computing devices' temperature. If the measured or predicted temperature is not below the predetermined minimum threshold (step 750), the containers or connectors may be reset back to their normal airflow mode configuration/position (step 760).

Figure 8:
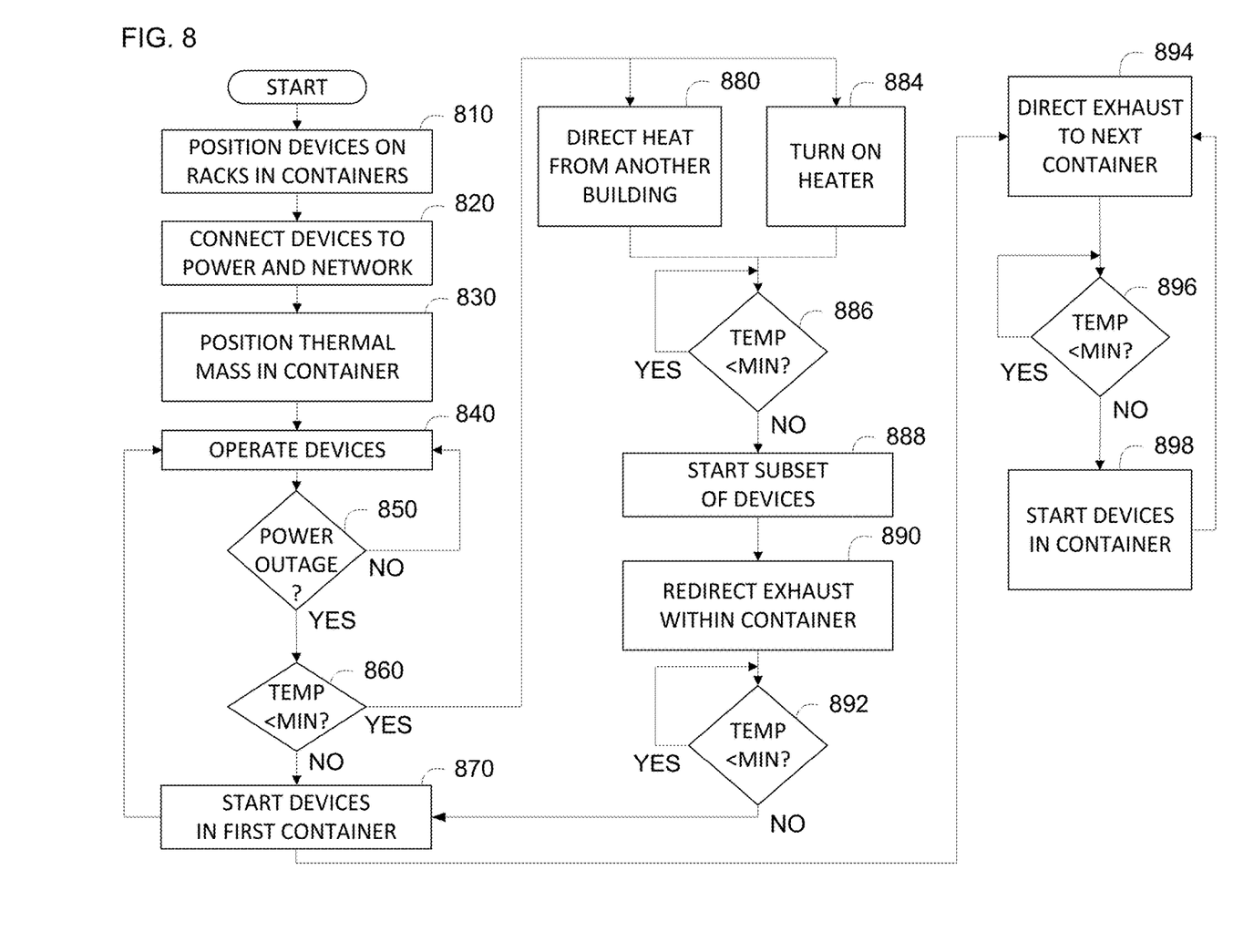
FIG. 8 is a flow chart of an example embodiment of a method for starting computing devices according to the teachings of the present disclosure.

Turning now to FIG. 8, a flow chart of an example embodiment of a method for starting computing devices according to the teachings of the present disclosure is shown. In this embodiment, devices are positioned on racks in containers (step 810) and connected to power and a network (step 820). Thermal mass is positioned in the container to moderate temperature drops for at least a subset of the computing devices in at least one container (step 830). The computing devices are operated (step 840) which raises the temperatures in the containers. In the event of a power outage (step 850), the temperature within at least one container is monitored (step 860). If the temperature is above the minimum operating range of the computing devices, the computing devices may be started (step 870). If the temperature is below the minimum operating range of the computing devices, the devices may be preheated by directing heat from another building (step 880) and or turning on a heater (step 884) that is configured to heat at least a subset of the computing devices in at least one container.

Once the temperature reaches or exceeds the minimum operating range of the computing devices (step 886), the subset of the devices may be safely started (step 888), and their exhaust may be redirected within the container (step 890) until the temperature for the other computing devices reaches or exceeds the minimum operating range (step 892).

Once the devices in the first container have been started, the exhaust from the first container may be directed to the next container (step 894). Once that container's temperature reaches or exceeds the minimum operating range (step 896), the devices in that container may be started (step 898). This process may be repeated (e.g., in series) until all containers have had their computing devices started.

Reference throughout the specification to "various embodiments," "with embodiments," "in embodiments," or "an embodiment," or the like, means that a particular feature, structure, or characteristic described in connection with the embodiment is included in at least one embodiments. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A method for operating a plurality of computing devices, the method comprising:
   positioning the plurality of computing devices on a plurality of racks in a plurality of containers, the plurality of containers each having an intake side vent and an exhaust side vent, wherein each of the computing devices comprises a cooling fan configured to generate an airflow through the computing device and exhaust hot air out the exhaust side vent;
   positioning a thermal mass in a first container selected from the plurality of containers;
   configuring each of the plurality of containers in a first mode, wherein in the first mode, cool air is drawn into each of the containers from the intake side vent and hot air is exhausted from a second side;
   reading temperature data; and
   in response to the temperature data being below a predetermined threshold, temporarily reconfiguring a second container selected from the plurality of container in a second mode to draw hot air exhausted by the first container into the second container's intake side vent.

2. The method of claim 1, further comprising:
   in response to a power outage and the temperature data being below a predetermined minimum starting temperature for the computing devices, starting the devices in the first container by temporarily reconfiguring the first container to receive warmer than ambient air from another building.

3. The method of claim 1, further comprising:
   in response to a power outage and the temperature data being below a predetermined minimum starting temperature for the computing devices, starting the devices in the first container by temporarily reconfiguring the first container to recirculate exhaust air from the computing devices within the first container, starting a subset of the computing devices, waiting until the temperature in the first container reaches the minimum starting temperature, and starting a remainder of the computing devices in the first container.

4. The method of claim 3, further comprising:
   in response to the power outage and the temperature data being below the predetermined minimum starting temperature for the computing devices, starting the devices in the first container temporarily by temporarily reconfiguring the first container to recirculate air within the first container, temporarily turning on a heater in proximity to a first subset of the computing devices, waiting until the temperature near the first subset of the computing devices is above the minimum starting temperature, starting the first subset of computing devices, waiting until the temperature in the first container is above the minimum starting temperature, starting a remainder of the computing devices in the first container, reconfiguring the first container to exhaust air into the second container, waiting until a temperature in the second container is above the minimum starting temperature, and starting the computing devices in the second container.

5. The method of claim 1, further comprising starting additional containers from the plurality of containers one-by-one in series.

6. The method of claim 1, wherein the thermal mass maintains the temperature of the computing devices in the first container above a minimum operating temperature for at least 49 minutes of a power outage occurring while ambient temperatures are at seasonal lows.

7. The method of claim 1, wherein the thermal mass maintains the temperature of the computing devices in the first container above a minimum operating temperature for at least a first hour of a cold weather power outage.

8. The method of claim 1, wherein the thermal mass comprises a thermal mass container at least partially filled with a phase change material.

9. The method of claim 8, wherein the phase change material changes phases between 0 degrees Celsius and 30 degrees Celsius.

10. The method of claim 1, further comprising temporarily moving the second container adjacent to the first container so that the second container's intake side vent is adjacent to the first container's exhaust side vent.

11. A method for starting computing devices in a container-based facility, the method comprising:
   a. positioning the plurality of computing devices on a plurality of racks in a plurality of containers;
   b. monitoring a first container's temperature;
   c. in response to the first container's temperature being below a predetermined minimum operating temperature, preheating at least a first subset of the computing devices in the first container;
   d. starting the first subset of computing devices in the first container;
   e. starting a remainder of the computing devices in the first container;
   f. redirecting warm exhaust from the first container to a second container;
   g. starting the computing devices in the second container; and
   h. repeating (f) and (g) for one or more remaining containers.

12. The method of claim 11, wherein preheating comprises turning on an electric heater positioned proximate the first subset of computing devices.

13. The method of claim 11, wherein preheating comprises directing heat from another building.

14. The method of claim 11, further comprising positioning a thermal mass in the first container.

15. The method of claim 14, wherein the thermal mass comprises a phase change material.

16. A system for managing temperatures in a data center, the system comprising:
   a plurality of containers each having an intake side vent and an exhaust side vent;
   a plurality of racks each positioned inside one of the plurality of containers and configured to hold a plurality of computing devices, wherein each computing device comprises a cooling fan configured to generate an airflow through the computing device and exhaust hot air out the exhaust side vent;

a thermal mass positioned within at least one of the plurality of containers, wherein the thermal mass maintains the temperature of at least a subset of the computing devices above a minimum operating temperature for at least one hour of a cold weather power outage; and a controller configured to:

(i) configure each of the plurality of containers in a first mode, wherein in the first mode, cool air is drawn into each of the containers from the intake side vents and hot air is exhausted from a second side, (ii) read temperature data, and (iii) in response to the temperature data being below a predetermined threshold, cause a temporary reconfiguration of a first selected one of the plurality of containers in a second mode to draw in hot air exhausted by one or more of the plurality of computing devices.

17. The system of claim 16, wherein in response to a power outage and the temperature data being below a predetermined minimum starting temperature for the plurality of computing devices, the controller is configured to preheat at least the subset of the computing devices.

18. The system of claim 17, wherein the controller preheats by turning on an electric heater.

19. The system of claim 17, wherein the controller preheats by directing air from another building into one or more of the plurality of containers.

* * * * *